(12) United States Patent
Goldie et al.

(10) Patent No.: US 6,765,207 B2
(45) Date of Patent: Jul. 20, 2004

(54) METHOD FOR PRODUCING A TRANSITION EDGE SENSOR

(75) Inventors: David John Goldie, Oxon (GB); Erdan Gu, Cambridge (GB)

(73) Assignee: Oxford Instruments Superconductivity Limited, Oxon (GB)

( * ) Notice: Subject to any disclaimer, the term of this patent is extended or adjusted under 35 U.S.C. 154(b) by 129 days.

(21) Appl. No.: 10/134,444

(22) Filed: Apr. 30, 2002

(65) Prior Publication Data

US 2002/0171040 A1 Nov. 21, 2002

(30) Foreign Application Priority Data

| May 30, 2001 | (JP) | ................................................ | 0113065 |
| May 16, 2001 | (GB) | ................................................ | 0111985 |
| May 16, 2001 | (GB) | ................................................ | 0111988 |
| Jul. 17, 2001 | (JP) | ................................................ | 0117404 |

(51) Int. Cl.[7] ............................................. H01L 27/18
(52) U.S. Cl. .................................................. 250/336.2
(58) Field of Search ...................................... 250/336.2

(56) References Cited

U.S. PATENT DOCUMENTS 5,880,468 A * 3/1999 Irwin et al. ............... 250/336.2
6,239,431 B1 * 5/2001 Hilton et al. .............. 250/336.2

OTHER PUBLICATIONS

F. Pröbst, et al., "Recent Progress in Calorimeters with Transition Edge Thermometers", Low Temperature Detectors for Nentrinos and Dark Matter IV Ed., NEDooth & Gr. L. Salmon Editions Frontieres (1992). pp. 193–202.

U. Nagel, et al., "Proximity Effect in Iridium–Gold Bilayers", J. Appl. Phys. 76 (7), Oct. 1, 1994, pp. 4262–4266.

D. Fukuda, et al., "Ir TES for X–ray Microcalorimeters", Nuclear Instruments & Methods in Physics Research, A 444 (2000) 241–244.

W. Seidel, et al., "Phase Transition Thermometers With High Temperature Resolution for Calorimetric Particle Detectors Employing Dielectric Absorbers", Physics Letters B, Mar. 1, 1990, vol. 236, No. 4, pp. 483–487.

* cited by examiner

Primary Examiner—Constantine Hannaher

(57) ABSTRACT

A method of producing a transition edge sensor comprises depositing a sensing material upon a substrate to form a sensing layer having an associated transition temperature. The transition temperature for the sensing layer is selected as desired. The desired transition temperature is produced by controlling the temperature of the substrate for the deposition process.

17 Claims, 2 Drawing Sheets

METHOD FOR PRODUCING A TRANSITION EDGE SENSOR

The present invention relates primarily to a method of producing a transition edge sensor, particularly for use in the analysis of radiation, along with a transition edge sensor produced according to the method.

Transition edge sensors (TES) are often used for measuring the energy of incident particles. These particles are generally photons although the energies of other kinds of particles such as thermal atoms and molecules can be measured. For this reason transition edge sensors can be found in instruments for infra-red bolometry and also for optical and X-ray spectroscopy and analysis equipment.

The primary functioning element of a TES is a region of material which undergoes a transition from conventional electrical conductivity behaviour to that of a superconductor below a specific temperature. Although this transition actually occurs over a range of temperatures, typically a transition temperature $T_c$ is defined at the mid-point in temperature between the two alternative modes of electrical conductivity.

In general, the material is provided as a thin film on a substrate, which is then placed in thermal contact with a heat sink at cryogenic temperatures. Incident particles are absorbed either by the material directly or by an additional "absorber" material placed in thermal contact with the TES. In either case the aim is to convert the energy of the incident particles into thermal energy which can then be accurately measured using the TES.

To achieve this, the thin film is maintained at a temperature within the transition region such as $T_c$. The absorption of a particle into the film causes a rise in the film temperature which may be detected as a corresponding increase in the film's resistivity. The superconducting transition in such TES devices occurs at very low temperatures close to absolute zero and typically $T_c$ may be below 300 mK.

It is desirable to obtain the maximum energy resolution possible as for example in X-ray analysis, this allows identification of the particular elemental materials from which the X-rays originate.

The energy resolution is a function of the heat capacity of the device. Very low temperatures produce the lowest heat capacity and best energy resolution results but such low temperatures often have a detrimental effect on the detection speed of the device as the thermal conductivity also decreases rapidly with decreasing temperature. Therefore at lower temperatures a slower count rate is achieved. Another factor is the cooling efficiency of the apparatus. A higher $T_c$ makes cooling easier. In some applications the very highest energy sensitivity will be required whereas in others the count rate will be more important. Therefore the desired $T_c$ is dependent upon the particular application.

Unfortunately only a small number of elemental superconductors exhibit a $T_c$ at convenient temperatures. Some examples of these include cadmium (Cd), iridium (Ir) and tungsten (W).

Some examples of sensors utilising these elements are described in "Phase transition thermometers with high temperature resolution for calorimetric particle detectors employing dielectric absorbers", W. Seidel et al, Physics Letters B, volume 236, number 4, Mar. 1, 1990, pages 483 to 487; and "Ir TES for x-ray microcalorimeters", D. Fukuda et al, Nuclear Instruments and Methods in Physics Research A, 444 (2000), pages 241 to 244.

As only a handful of superconducting elements have a convenient $T_c$, there is much interest in tunable transition temperatures. This has led to the development of "bi-layer" sensors, in which a second layer of material is deposited upon the first, one layer being a conventional conductor, thereby forming an "SN" bi-layer.

One example of such a bi-layer is that of aluminium (Al) and silver (Ag), the aluminium providing a layer which is superconducting and the silver layer behaving as a normal conductor. Such bi-layers have a transition temperature $T_c$ which is different from those of single film elemental superconductors due to the "proximity effect". By controlling the thickness of these two layers, $T_c$ can be controlled.

Although the control of $T_c$ using bi-layers is advantageous, the use of bi-layers incurs a number of disadvantages which are reflected in the performance of the device. In particular, the residual resistance ratio (RRR) is significantly reduced in such devices and this is caused by electron scattering occurring at the interface between the two materials of the bi-layer.

The RRR determines the critical current which in turn determines the dynamic range of the device. The thickness possible with a bi-layer is also limited which also limits the dynamic range.

Some examples of bi-layer TES devices are described in "Proximity effect in iridium-gold bilayers", U. Nagel et al, J. Appl. Phys. 76 (7), Oct. 10, 1994, pages 4262 to 4263; and "Recent progress in calorimeters with transition edge thermometers", F Pröbst et al, Low Temperature Detectors for Neutrinos and Dark Matter IV, Eds. N. E. Booth and G. L. Salmon, Editions Frontieres, 1992, pages 193 to 202.

In accordance with a first aspect of the present invention we provide a method of producing a transition edge sensor, the method comprising:

depositing a sensing material upon a substrate to form a sensing layer having a transition temperature; characterised by selecting a desired transition temperature of the sensing layer; and by controlling the temperature of the substrate for the deposition process in accordance with the selected transition temperature.

We have discovered that in some cases it is possible to control $T_c$ without the need to deposit a second conventional metal layer to form a bi-layer. By maintaining the substrate at a particular temperature prior to or during the deposition process, the resultant sensing layer is found to have a $T_c$ that is dependent upon the substrate temperature. Preferably the temperature of the substrate is controlled during the deposition process.

The temperature of the substrate may be controlled so that it is substantially at room temperature or below room temperature. However, typically the substrate temperature is controlled to be above room temperature and therefore the method preferably further comprises heating the substrate.

Advantageously the sensing material may be deposited in a single step as this reduces the fabrication time and the process complexity in producing a TES. However, an alternative multiple step deposition process could be used.

In known bi-layer devices a further deposition step is needed following the initial deposition step. Generally this would be performed in a similar manner to the deposition of the first layer. In the present invention a second deposition step is not needed. In some cases the processing of the device is simplified, as in bi-layer devices a separate processing step may be needed to define the dimensions of each layer of the bi-layer. There is also no requirement in the present invention for the use of different etch materials in the processing of the two layers of a bi-layer device.

There is an additional advantage in that the absence of two layers ensures that there is no reaction or interdiffusion between such layers. As a result the long term stability of the device is improved.

The invention also overcomes the problems caused by the interface between the layers in bi-layer devices. Such an interface tends to scatter electrons and therefore a TES made according to the method of the present invention will have a higher residual resistance ratio (RRR).

In general, the temperature of the substrate is controlled in accordance with a predetermined relationship relating the transition temperature to the temperature of the substrate. In one example an approximately linear relationship exists between the transition temperature $T_c$ and that of the substrate during deposition. As this is dependent upon both the substrate material and the deposited sensing material, more complex but quantifiable relationships may exist in other cases.

The temperature of the substrate may alternatively be controlled in accordance with predetermined data, for example, values of substrate temperatures and corresponding transition temperatures. A simple look-up table can be used in this case to enable selection of the appropriate substrate temperature given a desired transition temperature.

A number of superconducting materials exhibit this transition temperature effect when deposited on a substrate. In principle the substrate and the sensing material may therefore be formed from any such suitable materials. However, typically the sensing material will be a high purity elemental material which exhibits a superconducting transition at low temperatures. Examples of these include iridium, tungsten and hafnium.

Preferably however the sensing material will be iridium (Ir) and typically the substrate will be silicon nitride ($Si_3N_4$).

The present invention provides a method of producing a TES with a highly controllable $T_c$ over a large range of temperature. In the case of iridium deposited on silicon nitride, the $T_c$ of the sensor typically lies in the approximate range 50 to 300 mK.

In accordance with a second aspect of the present invention, we provide a transition edge sensor made in accordance with the method of the first aspect of the invention. Generally such a sensor has only a single deposited sensing layer, for example comprising iridium on a silicon nitride substrate.

An example of a method for producing a transition edge sensor according to the present invention will now be described with reference to the accompanying drawings, in which.

Figure 1:
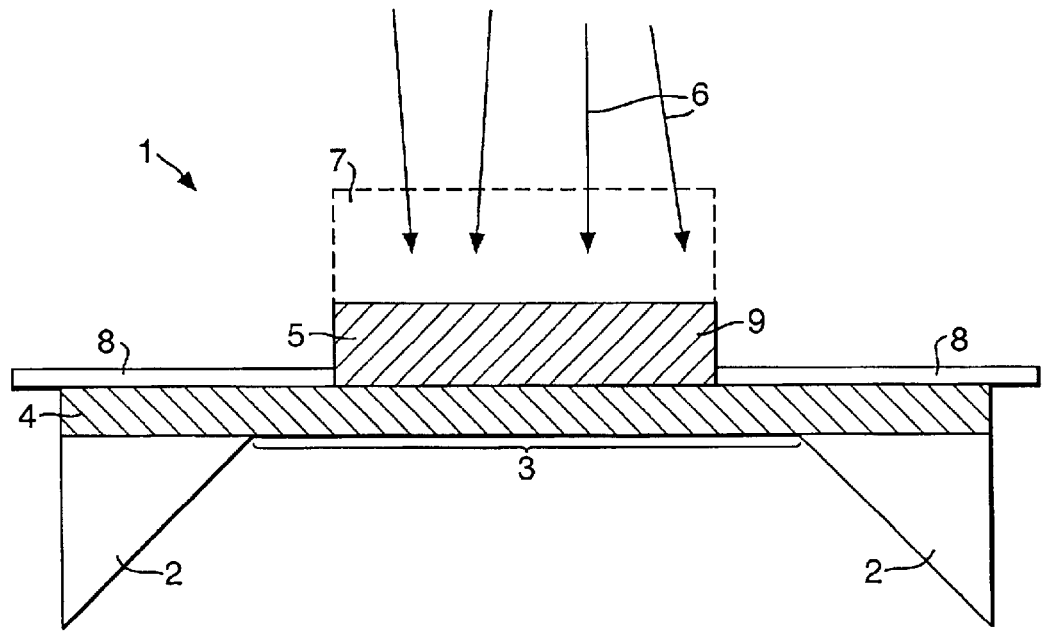
FIG. 1 is a schematic cross section of a microcalorimeter detector.

In FIG. 1 a schematic cross-section of a microcalorimeter detector is generally indicated at 1. This has a silicon support structure 2 formed from a single crystal silicon wafer having an approximate thickness of 380 microns. The silicon support 2 has an aperture within it comprising a window 3. The window 3 is covered by a thin membrane of an amorphous silicon nitride 4. Membranes of various thicknesses have been used, ranging from 0.1 to 1 microns, with the thickness in this case being about 0.5 microns. The silicon nitride membrane 4 generally extends across the entire surface of the silicon rather than just the window, as silicon wafers having silicon nitride coatings of this form are available commercially.

The silicon support 2 is arranged such that the silicon nitride membrane 4 is formed upon the (100) crystal planes. As can be seen from FIG. 1, the sides of the silicon support structure 2 which define the window 3 are sloped and are formed parallel to the (111) crystal planes of silicon, as will be described later.

An iridium layer 5 is positioned upon the opposite (upper) surface of the silicon nitride membrane. The iridium layer 5 is generally located at least partly above the area of the window 3, and in this case is positioned approximately centrally within it. The iridium layer 5 has approximate dimensions of 500 microns by 500 microns in a plane parallel to the silicon nitride, and a thickness of between 0.1 and 1 microns. In the present example, the iridium layer 5 forms the sensing material of a transition edge sensor (TES) 9. As shown in FIG. 1, the dimensions of the iridium layer 5 are arranged such that they are smaller than the extent of the window 3.

When in use, incident particles such as x-ray photons (indicated at 6) impinge upon the iridium layer 5 and are absorbed within it. In an alternative arrangement, an absorbent layer 7 may be provided on the top of the iridium layer 5 to absorb the incident particles 6. Bismuth (Bi) is a convenient material for use as an absorber 7 in that it has a low heat capacity but a high x-ray cross-section. This provides a good quantum efficiency at energy levels of technological interest such as around 5 keV. The optional bismuth layer is schematically indicated in FIG. 1 and a typical thickness for this is 1 to 5 microns. A conventional metal such as gold may also be used for the absorber layer 7.

In order to prevent any interaction between the absorber layer 7 and the iridium layer 5, the iridium could be provided with a thin oxide layer (not shown) to partition it from the absorber 7. This would prevent any undesirable interdiffusion or interaction effects between the iridium and the absorber 7.

When the incident particles 6 are absorbed in the iridium layer 5 or the absorber layer 7 as appropriate, their energy is converted into heat which raises the temperature of the iridium layer 5.

A number of contact wires 8 are provided to produce an electrical contact with the iridium layer 5 such that the transition edge sensor 9 may be operated. Preferably the contact wiring is made from a suitable superconducting material with a higher $T_c$ than that of the TES 9 (iridium) such as niobium (Nb) or aluminium (Al). The energy gap within these materials may be arranged such that perfect electrical contact is produced with the iridium layer 5 whilst no heat loss occurs through them. This effect is known as Andreev reflection.

The dimensions used for the TES are influenced by a number of factors such as its heat capacity and the heat flow in the sensor during operation (such that a phase separation into normal and superconducting regions is avoided).

A method for fabricating the device as shown in FIG. 1 will now be described.

Figure 2:
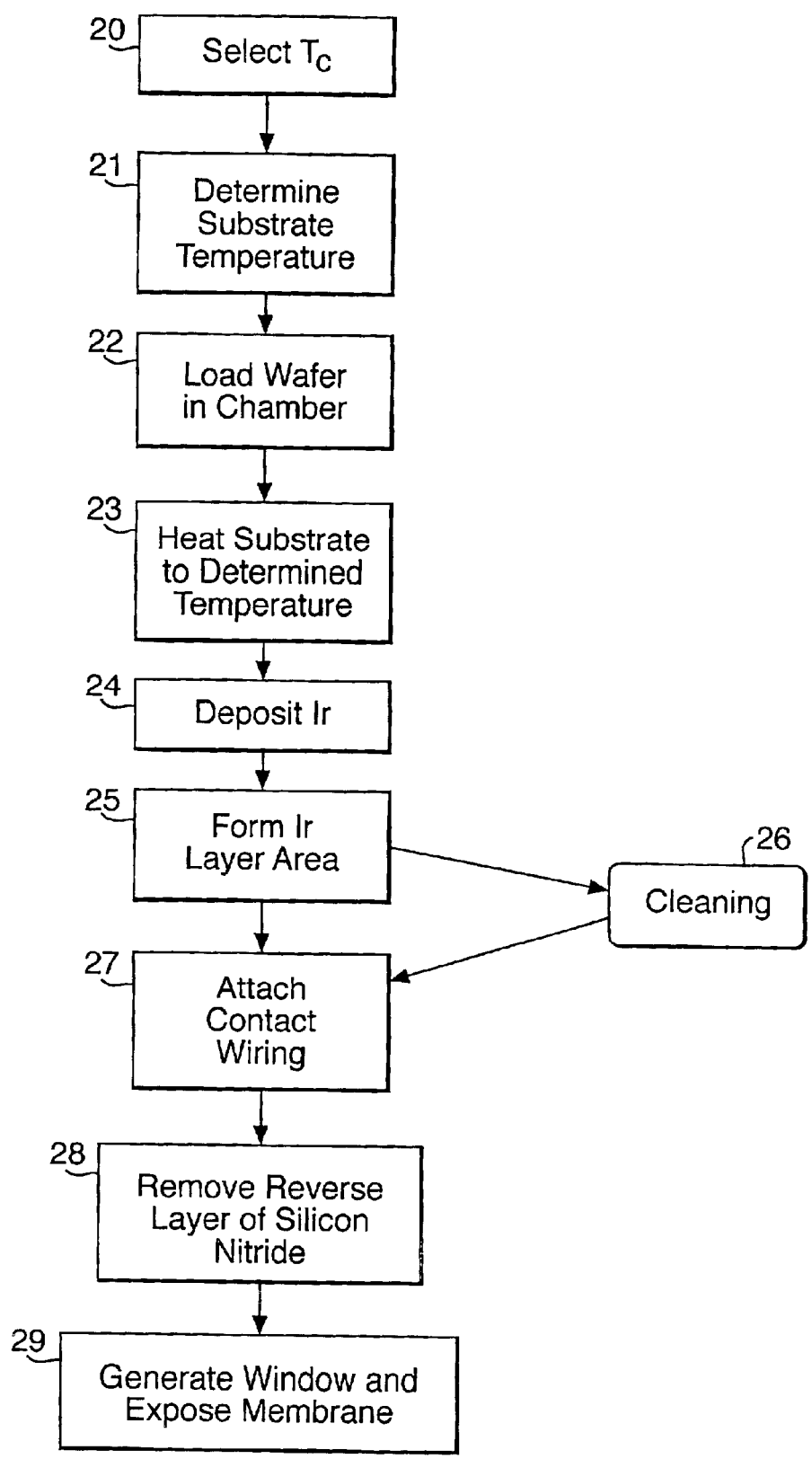
FIG. 2 is a flow diagram of a method of producing a TES.

Referring to FIG. 2, at step 20, the transition temperature $T_c$ of the iridium layer 5 to be deposited is selected. The control of the transition temperature in the present example is effected by appropriate control of the temperature of the substrate during the deposition process.

Figure 3:
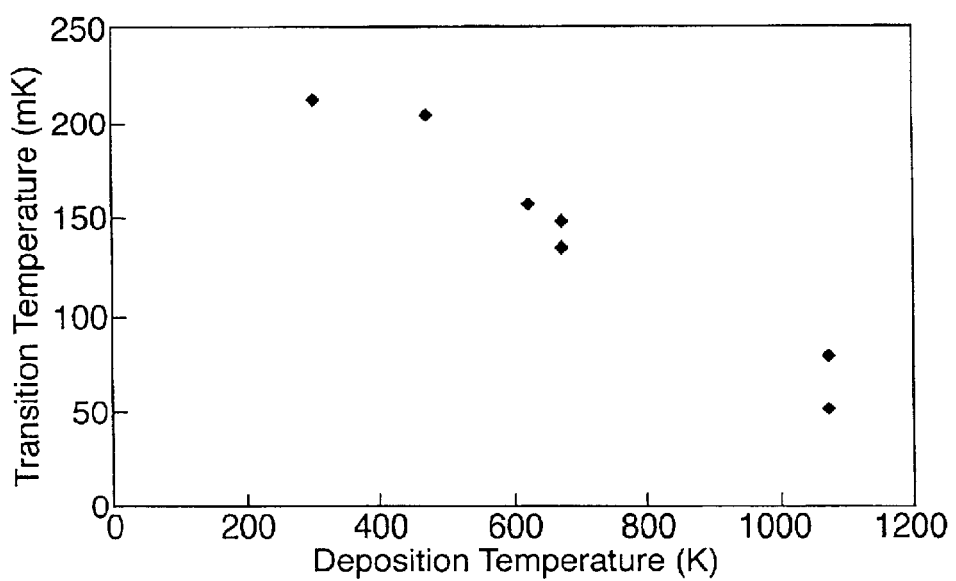
FIG. 3 shows the relationship between the $T_c$ of an iridium film and the deposition temperature for a silicon nitride substrate.

FIG. 3 is a graph of the transition temperature $T_c$ (millikelvin) for an iridium film on a silicon nitride substrate, as a function of the temperature (kelvin) of that substrate during deposition, referred to as the "deposition temperature" in FIG. 3. A number of experimental data points are shown in FIG. 3. It can be seen that these roughly indicate a linear relationship between the transition temperature and the deposition temperature, with a negative gradient, such that higher deposition temperatures tend to produce lower transition temperatures.

The main advantage of the present invention over known TES devices having a single deposited layer, is that the transition temperature $T_c$ is readily tunable. With regard to the present example, it can be seen from FIG. 3 that a very large temperature range for $T_c$ is obtainable by controlling the deposition temperature.

As shown by FIG. 3, a relationship can be established between the transition temperature $T_c$ and the deposition temperature of the substrate. Such a relationship is used following the selection of $T_c$ (at step 20 of FIG. 2) in order to determine a suitable substrate temperature. This occurs at step 21 of FIG. 2.

At step 22 (FIG. 2) a commercially available (100) single crystal silicon wafer, covered by a thin layer of amorphous silicon nitride, is loaded into the chamber of a conventional ultrahigh vacuum apparatus. The ultrahigh vacuum apparatus is arranged in a conventional manner having a resistive heating capability, along with a thermocouple positioned in close thermal contact with the silicon wafer. The base pressure of the vacuum system is at an ultrahigh vacuum level (for example 10–13 bar).

In the present example the chamber of the vacuum system is also provided with a DC magnetron sputterer for sputtering iridium onto one of the surfaces of the silicon nitride. Although the DC magnetron operates at an ambient temperature, it will be appreciated that a high temperature alternative such as electron beam evaporation could also be used.

The resistive heating and thermocouple are then used such that the substrate is heated to the required temperature (step 23).

At step 24 a layer of iridium is then deposited whilst the substrate is maintained at the determined temperature. With suitable calibration, an iridium layer of a predetermined thickness can be reproducibly obtained. The deposition rate of the iridium layer 5 is a function of the power of the magnetron when the chamber is at a particular argon pressure. Therefore by maintaining a particular argon pressure and magnetron power, the thickness of the iridium is a function of time.

Following deposition, the silicon wafer is removed from the high vacuum apparatus with the iridium deposited upon one side. In general the iridium is deposited over the whole of the surface of the silicon nitride and therefore a further step is used to limit the lateral extent of the iridium layer 5 to appropriate dimensions. This is performed at step 25 using conventional photolithographic methods in which a film is patterned and etched away such that a localised area of iridium layer 5 remains.

A further cleaning step may then also be performed at step 26, for example using ion beam milling, by returning the substrate to the vacuum chamber.

The aluminium (or niobium) contact wires 8 are then attached to the iridium layer 5 and to the underlying silicon nitride 4 at step 27. A conventional room temperature photoresist lift off method is used for this. An optional absorber 7 may be added at this stage using conventional room temperature deposition and photoresist lift-off methods.

In order to generate the window 3 covered by the silicon nitride membrane 4, a reactive ion etch such as $CHF_3$ gas is used to remove the silicon nitride layer at the window on the reverse side of the wafer at step 28. This exposes the silicon beneath, which is then etched away in a further step 29 using sodium hydroxide (NaOH) or potassium hydroxide (KOH) solution. This solution selectively etches upon particular crystal planes of silicon and it is this which produces the (111) plane faces surrounding the window 3. The sodium or potassium hydroxide etch removes the silicon beneath the window area until it reaches the silicon nitride membrane 4, against which it is ineffective.

The device of FIG. 1 is therefore produced and may then be used as a microcalorimeter detector.

The use of silicon nitride on a silicon wafer provides a convenient method of producing the TES having a substrate with appropriate thermal conductivity.

Other examples of material which may produce this effect include iridium upon a silicon substrate or tungsten upon a silicon or silicon nitride substrate.

Although the silicon nitride membrane 4 provides a partial thermal barrier to the refrigeration system, it is known that at very low temperatures, the thermal energies of electrons and phonons become decoupled. Therefore at very low temperatures (for example below 100 mK) it may not be as important to provide the substrate of the iridium layer 5 in the form of a low thermal conductivity membrane. In this case, the effect of electron-phonon decoupling could be used and a TES made in such a way would be suitable for example in the detection of photons having millimeter wavelengths.

What is claimed is:

1. A method of producing a transition edge sensor, the method comprising:
depositing a sensing material upon a substrate to form a sensing layer having a transition temperature, wherein a desired transition temperature of the sensing layer is selected and a temperature of the substrate for the depositing is controlled in accordance with the selected transition temperature.

2. A method according to claim 1, wherein the temperature of the substrate is controlled during the positing.

3. A method according to claim 1 or claim 2, wherein the controlling the temperature of the substrate comprises heating the substrate.

4. A method according to claim 3, wherein the temperature of the substrate is controlled in accordance with a predetermined relationship relating the transition temperature to the temperature of the substrate.

5. A method according to claim 3, wherein the temperature of the substrate is controlled in accordance with predetermined data relating the transition temperature to the temperature of the substrate.

6. A method according to claim 3, wherein the substrate is silicon nitride.

7. A method according to claim 3, wherein the sensing material is deposited as a single layer.

8. A method according to claim 1 or 2, wherein the temperature of the substrate is controlled in accordance with a predetermined relationship relating the transition temperature to the temperature of the substrate.

9. A method according to claim 8, wherein the substrate is silicon nitride.

10. A method according to claim 8, wherein the sensing material is deposited as a single layer.

11. A method according to claim 1 or 2, wherein the temperature of the substrate is controlled in accordance with predetermined data relating the transition temperature to the temperature of the substrate.

12. A method according to claim 11, wherein the sensing material is iridium.

13. A method according to claim 11, wherein sensing material is tungsten.

14. A method according to claim 11, wherein the substrate is silicon nitride.

15. A method according to claim 11, wherein the sensing material is deposited as a single layer.

16. A method according to claim 1 or 2, wherein the substrate is silicon nitride.

17. A method according to claim 1 or 2, wherein the sensing material is deposited as a single layer.

* * * * *